(12) United States Patent
Kurita et al.

(10) Patent No.: US 6,201,502 B1
(45) Date of Patent: Mar. 13, 2001

(54) ANTENNA DEVICE AND COMMUNICATION APPARATUS INCLUDING THE SAME

(75) Inventors: Junichi Kurita, Ishikawa-ken; Atsuyuki Yuasa, Yokohama; Kazunari Kawahata, Machida, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/378,522

(22) Filed: Aug. 20, 1999

(30) Foreign Application Priority Data

Aug. 25, 1998 (JP) .................................................. 10-238826
Apr. 12, 1999 (JP) .................................................. 11-104361

(51) Int. Cl.[7] .................................................. H01Q 1/24
(52) U.S. Cl. .................................. 343/702; 343/700 MS; 343/846
(58) Field of Search ............................ 343/700 MS, 702, 343/829, 846, 873, 848, 849; H01Q 1/24, 1/36

(56) References Cited

U.S. PATENT DOCUMENTS

| | | | |
|---|---|---|---|
| 5,861,854 | * | 1/1999 | Kawahata et al. .................... 343/702 |
| 5,867,126 | * | 2/1999 | Kawahata et al. .................... 343/702 |
| 5,959,582 | * | 9/1999 | Kawahata et al. ............ 343/700 MS |
| 6,040,806 | * | 3/2000 | Kushihi et al. ....................... 343/853 |

\* cited by examiner

Primary Examiner—Tho Phan
(74) Attorney, Agent, or Firm—Ostrolenk, Faber, Gerb & Soffen, LLP

(57) ABSTRACT

An antenna includes: a base having opposing first and second surfaces and opposing end surfaces; a radiation electrode covering at least a portion of the first major surface of the base; a power terminal disposed on the base and operable to conduct signal power which is at least one of received and transmitted by the antenna; a mounting substrate having spaced apart first and second major surfaces; a first ground electrode covering at least a portion of the second major surface of the base, wherein the base is disposed on the mounting substrate such that the second major surface of the base is coupled to the first major surface of the mounting substrate and a distance D is defined from the first major surface of the base to the second major surface of the mounting substrate, and the first ground electrode is electrically coupled to the first ground electrode such that a gain of the antenna is a function of the distance

18 Claims, 4 Drawing Sheets

ANTENNA DEVICE AND COMMUNICATION APPARATUS INCLUDING THE SAME

BACKGROUND OF THE INVENTION

1. Field of the Invention

The present invention relates to an antenna device and a communication apparatus including the same, and more specifically, the present invention relates to an antenna device and a communication apparatus including the same for use in mobile communications or the like.

2. Description of the Related Art

With a recent advance in miniaturization and high performance of mobile communication devices, particularly in those of mobile phones, an antenna device, which is to be mounted therein, has also been required to be further miniaturized and to have higher gain.

FIG. 5 and FIG. 6 show a conventional surface-mount type antenna and an antenna device incorporating the same, respectively. The basic structure of the surface-mount type antenna 1 shown in FIG. 5 is described in Japanese Unexamined Patent Publication No. 9-98015.

In FIG. 5, the surface-mount type antenna 1 is arranged by disposing some electrodes on a surface of a base member 2 of a rectangular parallelepiped configuration, which comprises a dielectric material such as ceramic or resin as one of the insulation materials. First, a ground electrode 3 is disposed on substantially the entirety of one major surface 2a of the base member 2. In addition, a strip-shaped radiation electrode 4 is disposed along the length direction of the base member 2 on the other major surface 2b of the base member 2. One end 4a of the radiation electrode 4 extends onto one end surface of the base member 2 to form an open-circuited end and the other end 4b extends onto a major surface 2a and over another end surface of the base member 2 to be connected to the ground electrode 3. Furthermore, a power feeding terminal 5 is disposed in the vicinity of the end 4a of the radiation electrode 4 on the end surface on which the end 4a of the radiation electrode 4 of the base member 2 is disposed. In this arrangement, the power feeding terminal 5 extends over the end surface of the base member 2 to the major surface 2a to be insulated from the ground electrode 3.

In an antenna device 6 incorporating the surface-mount type antenna 1 shown in FIG. 6, a mounting substrate 7 includes a substrate 8 comprising a dielectric material, i.e., an insulating material, having a major surface 8a, another major surface 8b, a substrate-ground electrode 9 disposed on the other major surface 8b and a power feeding line (not shown) which is insulated from the substrate-ground electrode 9. The surface-mount type antenna 1 is mounted on the substrate-ground electrode 9 in the vicinity of a corner of the mounting substrate 7. In this arrangement, the ground electrode 3 and the power feeding terminal 5 of the surface-mount type antenna 1 are connected to the substrate-ground electrode 9 and the power feeding line, respectively, on the mounting substrate 7 by soldering or the like.

In order to achieve miniaturization of a communication apparatus in which an antenna device has been mounted, miniaturization of the antenna device, i.e., reduction in the cubic volume taken by the surface-mount type antenna on a mounting substrate, is required. Thus, the effort required for making the surface-mount type antenna itself smaller is considerable. When the surface-mount type antenna 1 shown in FIG. 5 is miniaturized, the entire size of the base member 2 of the surface-mount type antenna 1 must be made smaller. However, with a surface-mount type antenna, there is a tendency in which the smaller the size of the base member, the smaller the antenna gain. Accordingly, miniaturization in the size of the base member 2 of the surface-mount type antenna 1 permits the antenna gain of the surface-mount type antenna 1, i.e., the antenna gain of the antenna device 6, to be reduced.

SUMMARY OF THE INVENTION

To overcome the above described problems, preferred embodiments of the present invention provide an antenna device (and a communication apparatus including the same) in which miniaturization does not cause the antenna gain to be deteriorated, i.e., antenna gains can be enhanced without increasing in size.

One embodiment of the present invention provides an antenna device comprising a surface-mount type antenna and a mounting substrate on which said surface-mount type antenna is mounted; said surface-mount type antenna comprising: a base member comprising an insulating member and having a first major surface, a second major surface opposite to said first major surface, and a plurality of end surfaces extending between said first and second major surfaces; a ground electrode disposed substantially on said first major surface of said base member; a strip-shaped radiation electrode disposed substantially on said second major surface of said base member and including an open-circuited end and a grounded end; a ground terminal connected to said ground end of the radiation electrode and insulated from said ground electrode; and a power feeding terminal disposed in the vicinity of said open-circuited end of the radiation electrode; said mounting substrate comprising: an insulation substrate comprising a first major surface and a second major surface; a first substrate-ground electrode disposed on said first major surface of said insulation substrate; a second substrate-ground electrode and a connection electrode respectively disposed on said second major surface of said insulation substrate and insulated from each other; and a through-hole connecting said connection electrode and said second substrate-ground electrode to said first substrate-ground electrode; and said ground electrode of said surface-mount type antenna being connected to said second substrate-ground electrode of said mounting substrate; and said ground terminal of said surface-mount type antenna being connected to said connection electrode of said mounting substrate.

Another embodiment of the present invention provides a communication apparatus including the above described antenna device.

Such an arrangement permits the antenna gain in the antenna device of the present invention to be increased without increasing in size. That is, since a ground terminal, to which the other end of a radiation electrode of a surface-mount type antenna is connected, is grounded by connecting to a first substrate-ground electrode disposed on a first major surface of a mounting substrate through a connection electrode and through-holes formed on a second major surface of the mounting substrate, the thickness of the base member of the surface-mount type antenna can be substantially increased, leading to improvement of antenna gains.

Furthermore, in the communication apparatus of the present invention, use of the antenna device above permits communication quality to be enhanced and permits cost reduction to be achieved.

Other features and advantages of the present invention will become apparent from the following description of preferred embodiments of the invention which refers to the accompanying drawings, wherein like reference numerals indicate like elements to avoid duplicative description.

BRIEF DESCRIPTION OF THE DRAWING(S)

DETAILED DESCRIPTION OF EMBODIMENTS OF THE INVENTION

Figure 1:
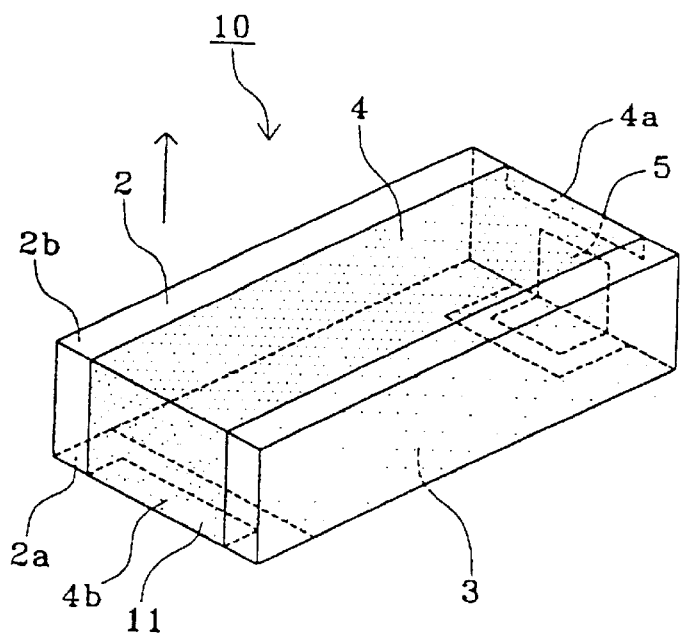
FIG. 1 is a perspective view showing one embodiment of a surface-mount type antenna used in an antenna device of the present invention.

Referring to the surface-mount type antenna 10 shown in FIG. 1, the other end 4b of a radiation electrode 4 is connected to a ground terminal 11 formed on a first major surface 2a of a base member 2. In this case, the ground terminal 11 is insulated from a ground electrode 3 similarly formed on the major surface 2a of the base member 2. As a result, the other end 4b of the radiation electrode 4 is insulated from the ground electrode 3.

Figure 2:
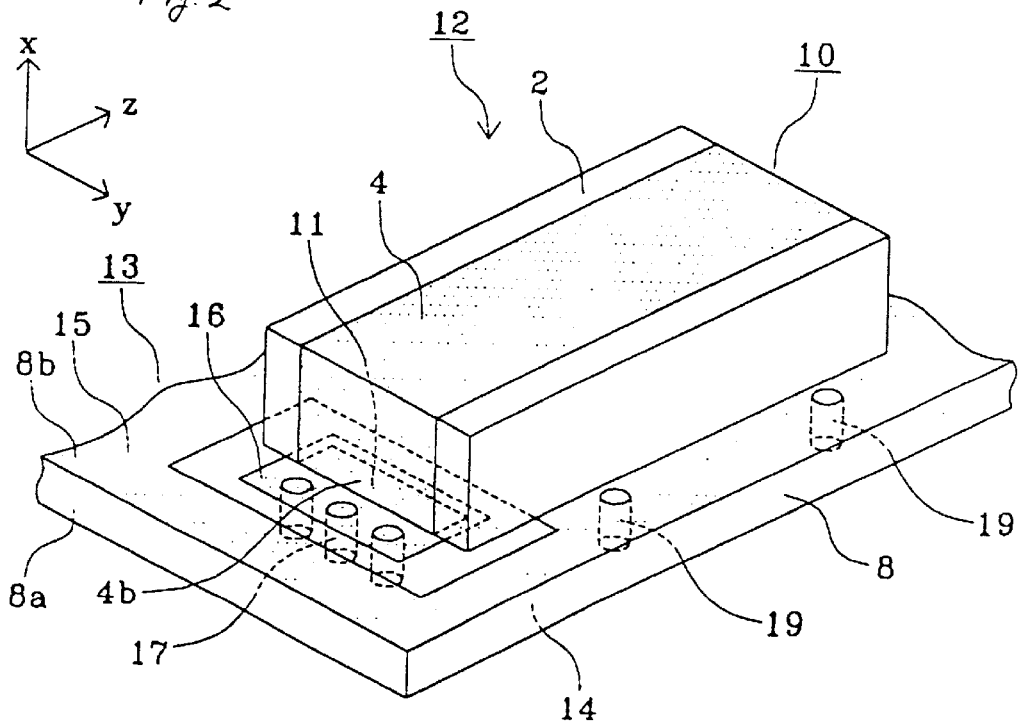
FIG. 2 is a partial perspective view showing one embodiment of the antenna device of the present invention.

In the antenna device 12 shown in FIG. 2, a mounting substrate 13 is arranged by disposing a first substrate-ground electrode 14 on a first major surface 8a of a substrate 8 and forming a second substrate-ground electrode 15 and a connection electrode 16 (which are mutually insulated) on a second major surface 8b of the substrate 8. In this case, the connection electrode 16 is connected to the first substrate-ground electrode 14 through three through-holes 17. In addition, the second substrate-ground electrode 15 is also connected to the first substrate-ground electrode 14 through a plurality of through-holes 19. The surface-mount type antenna 10 is mounted in the vicinity of a corner of the mounting substrate 13 by connecting the ground electrode 3 to the second substrate-ground electrode 15 of the mounting substrate 13 and connecting the ground terminal 11 to the connection electrode 16 of the mounting substrate 13.

The power feeding terminal 5 (not shown) of the surface-mount type antenna 10 is connected to a power feeding line disposed on the mounting substrate 13 (not shown). The power feeding line is hidden from view behind the surface-mount type antenna 10 and is not a principal part of the present invention.

Figure 3:
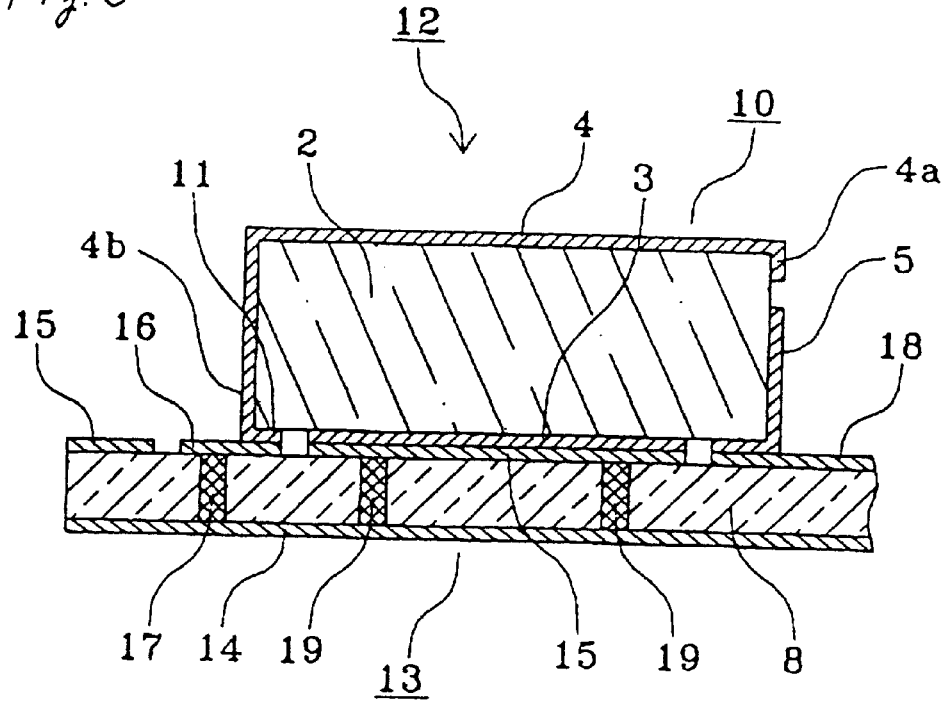
FIG. 3 is a sectional view of the antenna device shown in FIG. 2.

FIG. 3 shows a sectional view in which the antenna device 12 is cut along a surface which is parallel to the XZ-sided face and passes through the radiation electrode 4 of the surface-mount type antenna 10 and the through-hole 17 of the mounting substrate 13.

As is clear from FIG. 3, in the antenna device 12, the other end 4b of the radiation electrode 4 of the surface-mount type antenna 10 is grounded by connecting to the first substrate-ground electrode 14 through the ground terminal 11, the connection electrode 16 of the mounting substrate 13, and the through-holes 17.

The power feeding terminal 5 of the surface-mount type antenna 10 is connected to a power feeding line 18 disposed on the mounting substrate 13, although this is not shown in FIG. 2.

Figure 6:
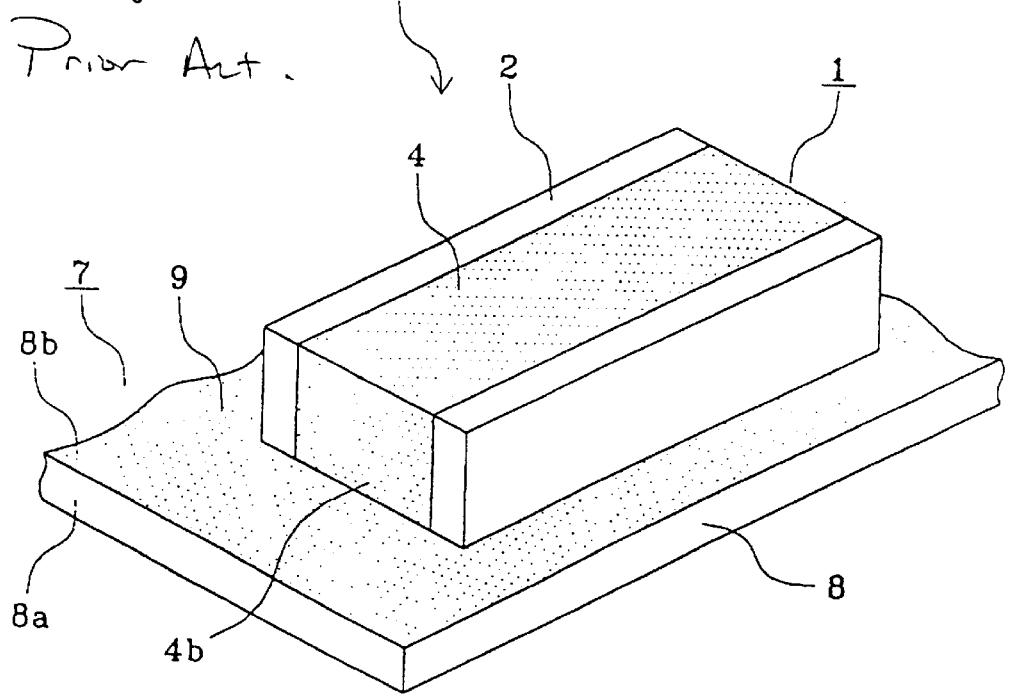
FIG. 6 is a perspective view showing a prior art antenna device.

In such an arrangement of the antenna device 12 of the present invention, the grounded position on the end 4b of the radiation electrode 4 of the surface-mount type antenna 10 is substantially different from that of the prior art. Indeed, the position of the substrate-ground electrode 9 (FIG. 6) disposed on the second major surface 8b of the substrate 8 in the prior art antenna device 6 is quite different from the position of the first substrate-ground electrode 14 formed on a first major surface 8a of the substrate 8 of the invention. Thus, the thickness of the surface-mount type antenna 10 of the invention is greater than the thickness of the base member 2 alone as is the case in the prior art. Indeed, the thickness of the antenna 10 of the invention is obtained by adding the thickness of the mounting substrate 8 with the thickness of the base member 2. Advantageously, although the actual size of the surface-mount type antenna 10 is not increased, the effective thickness of the surface-mount type antenna 10 is increased, and antenna gains of the antenna device 12 can be enhanced.

An experiment was conducted by the inventor of this application on the conventional antenna device 6 in which the bandwidth was 34.0 Mhz, the VSWR (Voltage Standing Wave Ratio), obtained when the antenna is viewed from the power feeding terminal side, was the bandwidth of 3.5 or less, the average of the YZ-sided face gain was −9.14 dBd (obtained in a direction horizontal to the YZ-sided face while putting the antenna device at the center), and the average of the ZX-sided face gain was −9.96 dBd (obtained in a direction horizontal to the ZX-sided face while putting the antenna device at the center). In the antenna device 12 of the present invention, experiments revealed that the bandwidth was 33.2 MHz, the average of the YZ-sided face gain was −8.33 dBd, and the average of the XZ-sided face gain was −9.09 dBd. The antenna gain of the invention improved although the bandwidth did not substantially change.

Generally, the larger the antenna gain, the narrower the bandwidth of a surface-mount type antenna, and the wider the bandwidth, the smaller the antenna gain. In the antenna device of the present invention, there is an advantage in which the antenna gain is improved without sacrificing the bandwidth. In this arrangement, the antenna device is formed by using a surface-mount type antenna which is designed with a slightly smaller gain and a wider bandwidth such that the antenna gain of the antenna device is substantially the same value as that of the conventional antenna device.

In the above described embodiment, the configuration of the radiation electrode of the surface-mount type antenna is made substantially into a straight-line form. However, other configurations such as an L-shaped form, a U-shaped form, or a meandering (e.g., S-shaped) form can be used. Furthermore, the number of the through-holes disposed on the mounting substrate is not restricted to three. Indeed, in order to reduce the inductance of the through-hole part, one or any number of through-holes can be employed. In addition, although the base member of the surface-mount type antenna comprises a dielectric member such as ceramics or resin, a magnetic material can also be used.

Figure 4:
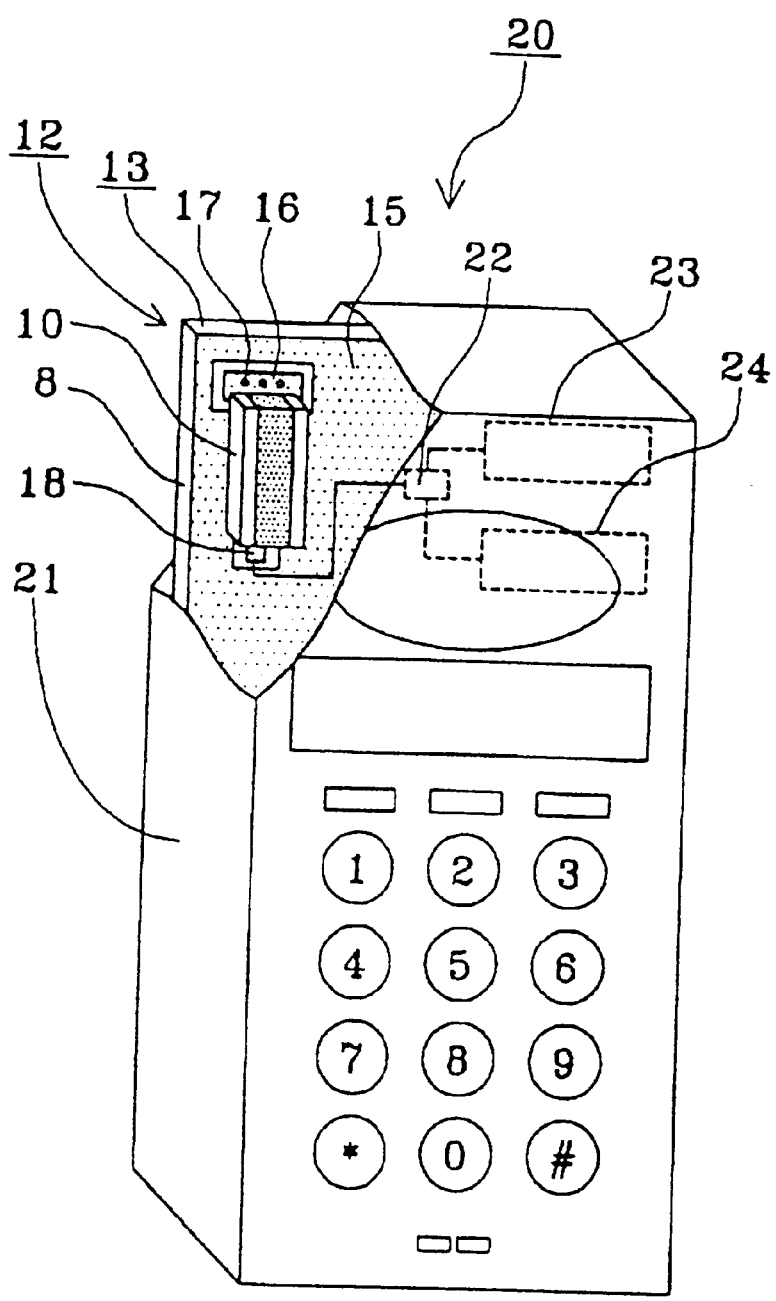
FIG. 4 is a perspective view showing another embodiment of a communication apparatus of the present invention.
Figure 5:
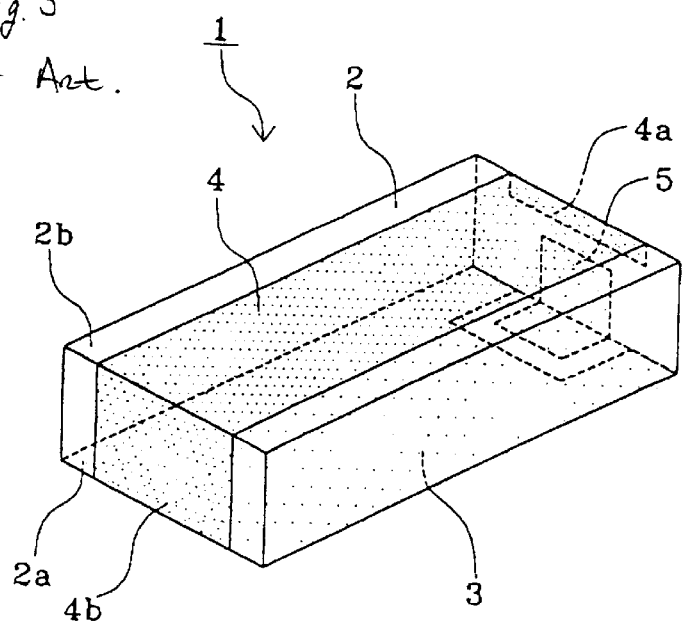
FIG. 5 is a perspective view showing a prior art surface-mount type antenna.

FIG. 4 shows a preferred embodiment of a communication apparatus including the antenna device of the present invention. In FIG. 4, the communication apparatus 20 includes an antenna device 12 disposed in a case 21. The antenna device 12 comprises a surface-mount type antenna 10 and a mounting substrate 13. Additionally, a first substrate-ground electrode (not shown) is disposed on a major surface of a substrate 8 comprising the mounting substrate 13. A second substrate-ground electrode 15, a connection electrode 16, and a power feeding line 18 are also formed on the substrate 13. In this arrangement, the connection electrode 16 is connected to the first substrate-ground electrode through through-holes 17. The surface-mount type antenna 10 is mounted at a corner of the mounting substrate 13. The ground electrode (not shown) of the surface-mount type antenna 10 is connected to the second substrate-ground electrode 15 of the mounting substrate 13, the ground terminal (not shown) is connected to the connection electrode 16, and the power feeding terminal (not shown) is connected to the power feeding line 18. Furthermore, the power feeding line 18 is connected to a transmission circuit 23 and a reception circuit 24 formed on the mounting substrate 13 through a switching circuit 22 similarly formed on the mounting substrate 13.

As describe above, use of the antenna device 12 of the present invention permits the antenna gain of the antenna device 12 to be improved and thereby permits the antenna gain of the communication apparatus 20 itself to be improved, resulting in improvement of the communication quality of the communication apparatus 20. Moreover, improvement of the antenna gain allows for a relaxation of the specifications of peripheral circuits and components such as a filter, an amplifier, a mixer, and a resonator included in the transmission circuit 23 and the reception circuit 24 of the communication apparatus 20. This leads to cost reductions of the peripheral circuits and components, and results in cost reductions of the communication apparatus itself.

While the invention has been particularly shown and described with reference to preferred embodiments thereof, it will be understood by those skilled in the art that the forgoing and other changes in form and details may be made therein without departing from the spirit of the invention.

What is claimed is:

1. An antenna, comprising:
   a base having opposing first and second major surfaces and opposing end surfaces;
   a first ground electrode covering at least a portion of the first major surface of the base;.
   a radiation electrode covering at least a portion of the second major surface of the base;
   a power terminal disposed on the base and operable to conduct signal power which is at least one of received and transmitted by the antenna;
   a mounting substrate having spaced apart first and second major surfaces;
   wherein
   the base is disposed on the mounting substrate such that the first major surface of the base is coupled to and adjacent the second major surface of the mounting substrate and a distance D is defined from the second major surface of the base to the first major surface of the mounting substrate, a first substrate ground electrode being provided on the first major surface of the mounting substrate and
   the first ground electrode is electrically coupled to the first substrate ground electrode such that a gain of the antenna is a function of the distance D.

2. The antenna of claim 1, further comprising:
   a connection electrode disposed on the second major surface of the mounting substrate, the connection electrode being electrically coupled to the first substrate ground electrode, wherein:
   the opposing ends of the base define a length, the opposing ends comprising first and second base ends;
   the radiation electrode includes a first open circuited end at the first base end and a second end at the second base end, the radiation electrode extending over the length of the base, over the second base end and to the first major surface of the base; and
   a second end of the first substrate ground electrode is electrically coupled to the connection electrode.

3. The antenna of claim 2, further comprising at least one conductive through-hole operable to electrically couple the connection electrode to the first substrate ground electrode.

4. The antenna of claim 2, further comprising:
   a second substrate ground electrode covering at least a portion of the second surface of the mounting substrate but terminating proximate to the connection electrode such that the connection electrode and the second substrate ground electrode are not connected.

5. The antenna of claim 4, wherein the second end of the radiation electrode extends at least partially onto the second major surface of the base and contacts the connection electrode.

6. The antenna of claim 4, further wherein the first ground electrode contacts the second substrate ground electrode of the mounting substrate.

7. The antenna of claim 6, further comprising at least one conductive through-hole operable to electrically couple the first and second substrate ground electrodes of the mounting substrate to one another.

8. The antenna of claim 1, wherein the first and second major surfaces and the opposing ends of the base define a parallelepiped.

9. The antenna of claim 1, wherein the base is formed from at least one material taken from the group consisting of a dielectric ceramic, a dielectric resin, and a magnetic material.

10. A communications device, comprising:
    at least one of a transmitter and receiver circuit; and
    an antenna coupled to the at least one of the transmitter and receiver circuit, the antenna including:
    a base having opposing first and second major surfaces and opposing end surfaces;
    a first ground electrode covering at least a portion of the first major surface of the base;
    a radiation electrode covering at least a portion of the second major surface of the base;
    a power terminal disposed on the base and operable to conduct signal power which is at least one of received and transmitted by the antenna;
    a mounting substrate having spaced apart first and second major surfaces;
    wherein
    the base is disposed on the mounting substrate such that the first major surface of the base is coupled to and adjacent the second major surface of the mounting substrate and a distance D is defined from the second major surface of the base to the first major surface of the mounting substrate, a first substrate ground electrode being provided on the first major surface of the mounting substrate and
    the first ground electrode is electrically coupled to the first substrate ground electrode such that a gain of the antenna is a function of the distance D.

11. The communications device of claim 10, further comprising:
    a connection electrode disposed on the second major surface of the mounting substrate, the connection electrode being electrically coupled to the first substrate ground electrode, wherein:

the opposing ends of the base define a length the opposing ends comprising first and second base ends;

the radiation electrode includes a first open circuited end at the first base end and a second end at the second base end, the radiation electrode extending over the length of the base, over the second base end and to the first major surface of the base; and a second end of the first substrate ground electrode is electrically coupled to the connection electrode.

12. The communications device of claim 11, further comprising at least one conductive through-hole operable to electrically couple the connection electrode to the first substrate ground electrode.

13. The communications device of claim 11, further comprising:

a second substrate ground electrode covering at least a portion of the second surface of the mounting substrate but terminating proximate to the connection electrode such that the connection electrode and the second substrate ground electrode are not connected.

14. The communications device of claim 13, wherein the second end of the radiation electrode extends at least partially onto the first major surface of the base and contacts the connection electrode.

15. The communications device of claim 13, further wherein the first ground electrode contacts the second substrate ground electrode of the mounting substrate.

16. The communications device of claim 15, further comprising at least one conductive through-hole operable to electrically couple the first and second substrate ground electrodes of the mounting substrate to one another.

17. The communications device of claim 10, wherein the first and second major surfaces and the opposing ends of the base define a parallelepiped.

18. The communications device of claim 10, wherein the base is formed from at least one material taken from the group consisting of a dielectric ceramic, a dielectric resin, and a magnetic material.

* * * * *